United States Patent
Mortazawi et al.

(10) Patent No.: US 12,206,388 B2
(45) Date of Patent: Jan. 21, 2025

(54) BULK ACOUSTIC WAVE RESONATORS EMPLOYING MATERIALS WITH PIEZOELECTRIC AND NEGATIVE PIEZOELECTRIC COEFFICIENTS

(71) Applicant: THE REGENTS OF THE UNIVERSITY OF MICHIGAN, Ann Arbor, MI (US)

(72) Inventors: Amir Mortazawi, Ann Arbor, MI (US); Milad Zolfagharloo Koohi, Ann Arbor, MI (US)

(73) Assignee: The Regents of The University of Michigan, Ann Arbor, MI (US)

( * ) Notice: Subject to any disclaimer, the term of this patent is extended or adjusted under 35 U.S.C. 154(b) by 795 days.

(21) Appl. No.: 17/237,215

(22) Filed: Apr. 22, 2021

(65) Prior Publication Data

US 2021/0384887 A1 Dec. 9, 2021

Related U.S. Application Data (60) Provisional application No. 63/014,084, filed on Apr. 22, 2020.

(51) Int. Cl.
    *H03H 9/13* (2006.01)
    *H03H 3/02* (2006.01)
    *H03H 9/02* (2006.01)
    *H03H 9/205* (2006.01)
    *H03H 9/60* (2006.01)

(52) U.S. Cl.
    CPC .............. *H03H 9/205* (2013.01); *H03H 3/02* (2013.01); *H03H 9/02015* (2013.01); *H03H 9/0211* (2013.01); *H03H 9/131* (2013.01); *H03H 9/605* (2013.01)

(58) Field of Classification Search
    CPC ............ H03H 9/02; H03H 9/17; H03H 9/205; H03H 9/60
    See application file for complete search history.

(56) References Cited

U.S. PATENT DOCUMENTS

| 5,872,493 | A | 2/1999 | Ella |
| 5,929,555 | A * | 7/1999 | Sugimoto .............. H03H 9/176 310/368 |

(Continued)

FOREIGN PATENT DOCUMENTS

| DE | 102016123708 B3 | 4/2018 |
| EP | 1464115 B1 | 10/2009 |

(Continued)

*Primary Examiner* — Andrea Lindgren Baltzell
*Assistant Examiner* — Alan Wong
(74) *Attorney, Agent, or Firm* — Harness, Dickey & Pierce, P.L.C.

(57) ABSTRACT

Bulk acoustic wave resonators are presented. Such resonators typically operate based on a dynamic nonuniform effective piezoelectricity in composite multilayer ferroelectrics with large electrostriction coefficients, like barium strontium titanate (BST). Harmonic resonance modes of a multilayer bulk acoustic wave resonator can be selectively excited with an electromechanical coupling coefficient equal to the fundament mode, which is contrary to the trend $K2 \propto 1/n2$ exhibited by conventional piezoelectric bulk acoustic resonators. Such a resonator allows for the design of a new class of band-switching filters.

14 Claims, 9 Drawing Sheets

(56) References Cited

U.S. PATENT DOCUMENTS

| | | | | |
|---|---|---|---|---|
| 6,437,484 | B1 * | 8/2002 | Nishimura | H03H 9/175 310/334 |
| 6,744,184 | B2 * | 6/2004 | Funaki | H03H 9/178 310/366 |
| 6,933,807 | B2 | 8/2005 | Marksteiner et al. | |
| 6,975,183 | B2 * | 12/2005 | Aigner | H03H 9/0095 29/25.35 |
| 7,253,552 | B2 * | 8/2007 | Miyazawa | H10N 30/2023 310/323.16 |
| 8,336,373 | B2 * | 12/2012 | Kwon | G01G 3/13 73/61.79 |
| 8,575,823 | B2 * | 11/2013 | Nishikubo | H10N 30/206 310/332 |
| 10,241,223 | B2 * | 3/2019 | Jin | G01V 1/186 |
| 10,491,192 | B1 * | 11/2019 | Plesski | H03H 9/02015 |
| 2021/0036678 | A1 | 2/2021 | Burak et al. | |

FOREIGN PATENT DOCUMENTS

| | | |
|---|---|---|
| EP | 1196990 B1 | 9/2014 |
| KR | 20080034201 A | 4/2008 |

\* cited by examiner

_Fig-3_

_Fig-4A_

_Fig-4B_

BULK ACOUSTIC WAVE RESONATORS EMPLOYING MATERIALS WITH PIEZOELECTRIC AND NEGATIVE PIEZOELECTRIC COEFFICIENTS

CROSS-REFERENCE TO RELATED APPLICATIONS

This application claims the benefit of U.S. Provisional Application No. 63/014,084, filed on Apr. 22, 2020. The entire disclosure of the above application is incorporated herein by reference.

The present disclosure relates to bulk acoustic wave resonators.

GOVERNMENT CLAUSE

This invention was made with government support under ECCS1608338 awarded by the National Science Foundation. The government has certain rights in the invention.

BACKGROUND

Wireless communication has become an integral part of today's life, continuously impacting our everyday activities. A multitude of functionalities are offered by recent generations of mobile phones, resulting in a rapid growth of wireless technologies and increased demand for even higher data rates. To accommodate consumers' continuous demand for high data throughputs, the number of frequency bands allocated for wireless communication has also steadily been increasing Bandpass filters, multiplexers, and switchplexers in radio frequency (RF) transceivers are essential for the coexistence of different wireless standards/technologies and play a vital role in efficient spectrum usage. Current mobile devices use many acoustic wave bandpass filters for frequency band selection and interference rejection. With the advent of the 5G, multiple mm-Wave frequency bands are designated for personal communications, further increasing the demand for high performance filters in communication systems. However, conventional SAW and BAW technologies cannot support mm-Wave frequency bands, since the current SAW or BAW resonator technologies cannot achieve high quality factors (Q) and large electromechanical coupling coefficients ($K_{eff}^2$) above 6 GHz, required for designing low loss and wide bandwidth (BW) filters. Therefore, new innovations in acoustic wave resonator and filter technologies are needed that enable the design of high Q and large electromechanical coupling coefficient resonators at higher frequencies.

This section provides background information related to the present disclosure, which is not necessarily prior art.

SUMMARY

This section provides a general summary of the disclosure, and is not a comprehensive disclosure of its full scope or all of its features.

A bulk acoustic wave resonator is presented. The bulk acoustic wave resonator is comprised of: a first electrode; a second electrode; and a transduction structure sandwiched between the first electrode and the second electrode. The transduction structure includes at least a first layer of piezoelectric material and a second layer of a material that exhibits a negative piezoelectric effect, where the resonator is configured to exhibit an electromechanical coupling coefficient that remains theoretically constant for the nth resonance harmonic mode. During operation, the first electrode and the second electrode are configured to receive an electric signal and the transduction structure converts the electric signal to an acoustic wave within the resonator.

In one aspect, the transduction structure is preferably comprised of multiple layers alternating between a first layer of piezoelectric material and a second layer of a material that exhibits a negative piezoelectric effect and without any electrodes disposed between the multiple layers.

In one embodiment, the bulk acoustic wave resonator of claim is fabricated on a substrate, such that a portion of the substrate under the resonator structure is removed, thereby forming a film bulk acoustic resonator (FBAR).

In another embodiment, the bulk acoustic wave resonator is fabricated on a substrate with a reflector disposed between the resonator structure and the substrate, thereby forming a solidly mounted resonator structure (SMR).

In yet another embodiment, the bulk acoustic wave resonator is fabricated on a substrate, where both electrodes are used on one side of the transduction structure to laterally excite the resonator, thereby forming a laterally excited bulk acoustic wave resonator (XBAR).

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations and are not intended to limit the scope of the present disclosure.

Corresponding reference numerals indicate corresponding parts throughout the several views of the drawings.

DETAILED DESCRIPTION

Example embodiments will now be described more fully with reference to the accompanying drawings.

Figures 1A, 1B:
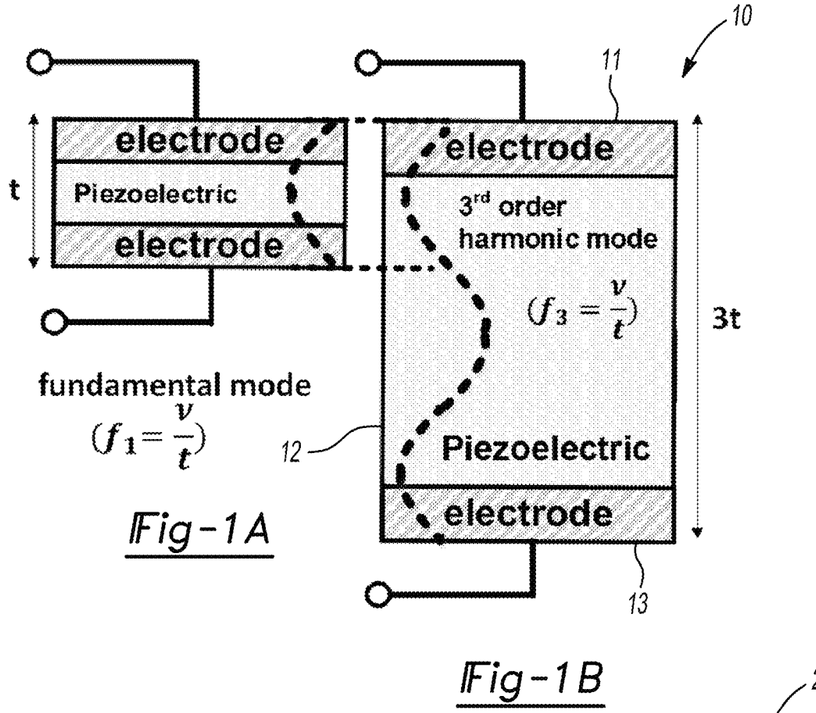
FIGS. 1A and 1B are diagrams showing two resonator structures with fundamental and $3^{rd}$ order harmonic resonance modes, respectively.

FIGS. 1A and 1B depict a bulk acoustic wave resonator 10. The bulk acoustic wave resonator is comprised generally of a first electrode 11, a second electrode 13, and a transduction structure 12 sandwiched between the two electrodes 11, 13. As further described below, the transduction structure 12 includes at least a first layer of piezoelectric material and a second layer of a material that exhibits a negative piezoelectric effect, where the resonator structure is configured to exhibit an electromechanical coupling coefficient that remains constant for the nth resonance harmonic mode, as opposed to electromechanical coupling coefficients of conventional resonators that drop as $1/n^2$.

During operation, an electric signal is applied between the first electrode 11 and the second electrode 13. The transduction structure 12 converts the electrical signal to an acoustic wave that propagates across the resonator. The resonance frequency of the resonator structure is dictated by the device membrane thickness. In such a structure, in order to maintain a low ohmic loss, the electrode to piezoelectric thickness ratio is large in very thin resonator membranes at mm-Wave frequencies. In such resonators, the acoustic energy ratio in the metal electrodes is increased, causing high acoustic losses and reduced $K_{eff}^2$. Moreover, such thin membranes are not mechanically robust, suffering from low manufacturing yields. Therefore, the conventional thickness scaling of acoustic resonators applied at lower frequencies is no longer practical at mm-Wave frequencies.

In contrast, thick bulk acoustic wave resonators operating at the higher-order harmonic resonance modes using thick membranes can be designed at high microwaves and millimeter waves frequencies. For instance, a resonator, excited at its $3^{rd}$ order harmonic frequency (equal to the fundamental resonance frequency of the resonator shown in FIG. 1A) is shown in FIG. 1B. In this structure, the ratio of acoustic energy inside the electrodes to the energy inside the resonator piezoelectric material is reduced. However, in such a bulk acoustic wave resonator, the electromechanical coupling coefficient of harmonic resonance modes also drops proportional to $1/f_n^2$ (i.e., for $n^{th}$ harmonic mode ($f_n = nf_1$) the electromechanical coupling coefficient is $$K_{eff,n}^2 = \frac{1}{n^2} K_{eff,1}^2).$$

Ultimately the low electromechanical coupling coefficient of very high microwave resonators limits their utility in filter design due to their high insertion losses and limited achievable bandwidth dictated by their low electromechanical coupling factors. The drawbacks of the above approaches are remedied by the new resonator structure described in the following paragraphs.

Figure 2:
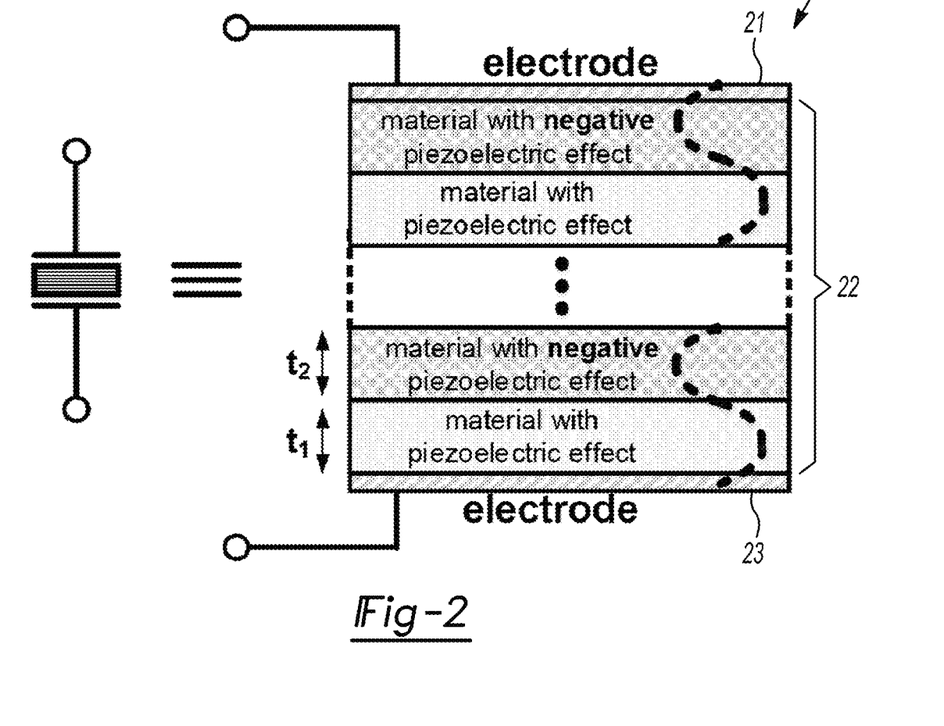
FIG. 2 is a diagram of a resonator structure with multiple layer for use in a bulk acoustic wave filter.

FIG. 2 depicts an example of bulk acoustic wave resonator 20 with a multiple layer transduction structure. The bulk acoustic wave resonator 20 is comprised of a transduction structure 22 sandwiched between a pair of electrodes 21, 23. During operation, electric signal is applied between the pair of electrodes 21, 23, and the transduction structure 22 converts the electrical signal to an acoustic wave that propagates through the resonator.

In a simple embodiment, the resonator structure 22 is comprised of a first layer of piezoelectric material and a second layer of a material that exhibits a negative piezoelectric effect. For example, ferroelectric materials exhibit positive and negative piezoelectric coefficient that can be used to control the effective piezoelectric coefficient in the bulk of a resonator. In such structure, the device can be designed to resonate at a desired harmonic resonance mode of the structure with a large electromechanical coupling coefficient not following the trend of $$K_{eff,n}^2 = \frac{1}{n^2} K_{eff,1}^2,$$

associated with conventional resonators with single layer of piezoelectric material. The multilayered resonator can maintain a high electromechanical coupling coefficient at high microwave and millimeter-wave frequencies.

On the other hand, the quality factor of the multilayer resonator composed of negative and positive ferroelectric layers is enhanced as compared to conventional single-layer resonators. This is due to the fact that the total thickness of the transduction layer in such resonators is multiple wavelengths, which: 1) lowers the fraction of acoustic energy lost in electrodes, and 2) allows to minimize the electric energy loss by increasing the electrodes' thickness. Resonators with large quality factors enable the design of filters with low insertion losses.

In a more generalized embodiment, the transduction structure 22 is comprised of multiple layers alternating between a layer of piezoelectric material and a second layer of a material that exhibits a negative piezoelectric effect. Multiple layers of material exhibiting positive and negative piezoelectricity can either be directly stacked on top of each other (without intermediate layers disposed therebetween) or can be separated by thin conductor layers. In some instances, the materials comprising the two layers are different. That is, the piezoelectric material has piezoelectric coefficient with a magnitude different than the piezoelectric coefficient of the material that exhibits a negative piezoelectric effect.

In some instances, the same material can be used to form layers of positive and negative piezoelectricity in the transduction structure 22. In these instances, a bias electrode (layer) is used in between the alternating layers of the transduction layers. A bias voltage is, in turn, applied across the layers (or subset of layers) using the bias electrode to generate the desirable piezoelectric coefficients as is further described below.

Multiple layers of two different materials with positive and negative piezoelectric coefficients are employed as transduction layers. Such a structure supports a harmonic resonance mode with an electromechanical coupling coefficient comparable to electromechanical coupling coefficient of its fundamental mode $K_{eff,n}^2 = K_{eff,1}^2$, (contrary to the conventional piezoelectric overloaded BAW resonators with $$K_{eff,n}^2 = \frac{1}{n^2} K_{eff,1}^2).$$

For example, the electromechanical coupling coefficient of the $n^{th}$ harmonic mode of the resonator shown in FIG. 2, consisting of n positive and negative piezoelectric layers, can be approximated by (1) to be $$K_{eff,n}^2 = \frac{8}{\pi^2} \frac{d_o^2}{s\epsilon},$$

which is equal to the $K_{eff}^2$ of the fundamental resonance mode, when the negative and positive piezoelectric coefficients have a similar magnitude.

$$K_{eff,n}^2 = \frac{\left(\int_A \int_{-\frac{t_{total}}{2}}^{\frac{t_{total}}{2}} d_{eff}(z) ET(z) dz\right)^2}{\int_V \epsilon E^2 dV \int_V sT^2(z) dV} = \qquad (1)$$

$$\frac{d_o^2}{2s\epsilon \left(\frac{t_{total}}{2}\right)^2} \left(\int_{-\frac{t_{total}}{2}}^{\frac{t_{total}}{2}} \tilde{d}(z) \tilde{u}_N'(z) dz\right)^2 = \frac{8}{\pi^2} \frac{d_o^2}{s\epsilon}$$

where s, and $\epsilon$ are the elasticity, and permittivity of the piezoelectric layers and $\tilde{d}(z)$ is the normalized piezoelectric coefficient in each layer, and $\tilde{u}_N'(z)$ is the normalized stress distribution throughout the bulk of the resonator. For simplicity, the thickness of electrodes is assumed to be negligible, the elasticity and permittivity for both materials are assumed to be similar, and the magnitude of positive and negative piezoelectric coefficients for all layers are assumed to be equal to $d_o$, (In practice different layers can have different $d_o$ values). These approximations however do not affect the general conclusion drawn that is such a multilayered resonator can maintain a high electromechanical coupling coefficient for higher order modes.

Figure 3:
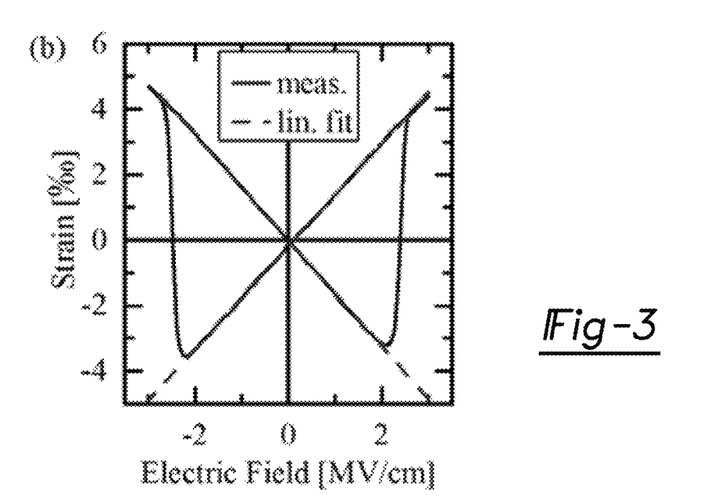
FIG. 3 is a graph showing the longitudinal displacement butterfly curve of the inverse piezoelectric effect for $Al_{0.64}Sc_{0.36}N$.

As discussed above, the resonator 20 is comprised of multiple layers alternating between layers of (positive) piezoelectric material and layers of a material that exhibits a negative piezoelectric effect. Exemplary materials that can exhibit positive piezoelectric effect include but are not limited to aluminum nitride (AlN), zinc oxide (ZnO), lead zirconate titanate, and bismuth titanium oxide. Exemplary materials that exhibit negative piezoelectric effect include but are not limited to copper indium thiophosphate CuInP$_2$S$_6$ (CIPS), aluminum nitride, scandium aluminum nitride, barium titanate, strontium titanate, barium strontium titanate (Ba$_x$Sr$_{(1-x)}$TiO$_3$), lithium niobate, trialkylbenzene-1, 3,5-tricarboxamide (BTA), and poly(vinylidene fluoride) (PVDF) and its copolymers with trifluoroethylene (P(VDF-TrFE)). For instance, the longitudinal displacement butterfly curve of the inverse piezoelectric effect in Al$_{0.64}$Sc$_{0.36}$N has broad linear regimes with almost equal slopes, corresponding to an effective longitudinal piezoelectric coefficient $d_{33}$ of 15.7 pm/V and a negative piezoelectric coefficient of $-16.2$ pm/V as shown in FIG. 3. So, for instance, Al$_{0.64}$Sc$_{0.36}$N can be poled with a DC bias voltage to operate either in negative or positive piezoelectric regimes. Thus, it is understood the positive piezoelectric effect or the negative piezoelectric effect is inherent in some materials while in other materials a desired effect must be conditioned as noted above.

Figure 4A:
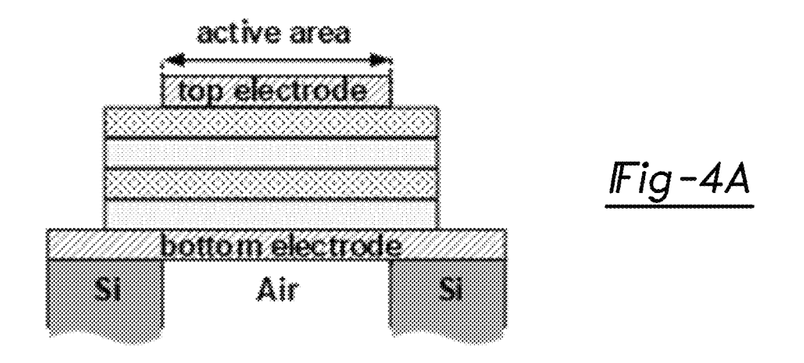
FIGS. 4A and 4B are cross-sectional views of the multi-layer resonator implemented in the form of thin film acoustic wave resonator and solidly mounted resonator, respectively.
Figure 4B:
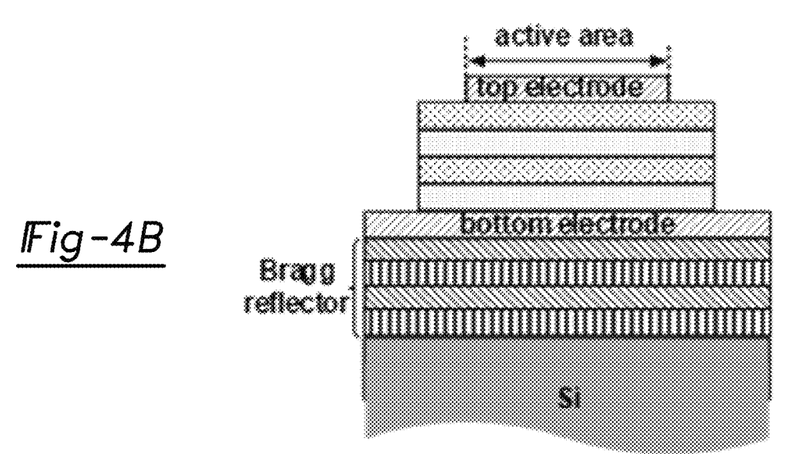
Figure 5A:
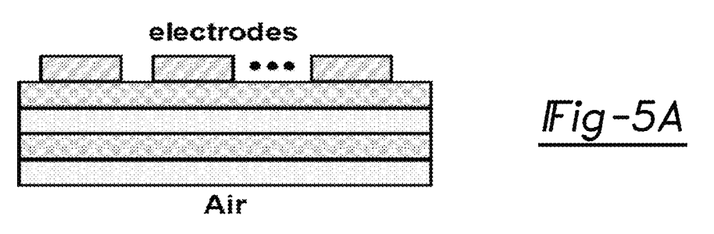
FIGS. 5A and 5B are cross-sectional views of the multi-layer resonator implemented in the form of laterally excited bulk acoustic wave resonator (XBAR).
Figure 5B:
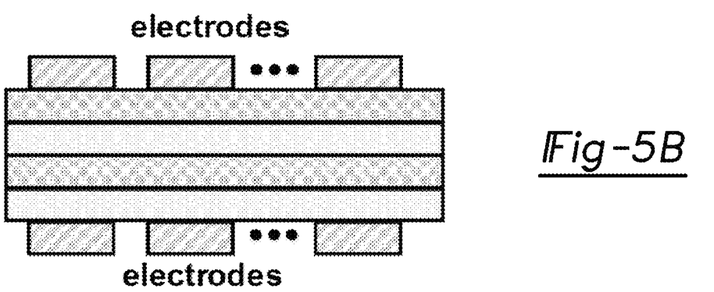

FIGS. 4A and 4B illustrate that the proposed resonator structure can be implemented in the form of a thin film bulk wave resonator (FBAR) or a solidly mounted resonator (SMR), respectively. In the film bulk acoustic resonator (FBAR), a portion of the substrate under the resonator structure is removed, thereby forming an air gap under the bottom electrode as seen in FIG. 4A. In SMR structure, the acoustic wave reflection at the bottom of the resonator is provided through a Bragg reflector instead of an air interface. The multilayer resonator with positive and negative piezoelectric coefficient transduction materials is applicable to laterally excited bulk acoustic wave resonator (XBAR) design (e.g., see FIG. 5). An XBAR device is conventionally fabricated based on a single layer of piezoelectric material, where a shear mode is excited with a set of interdigitated electrodes on one side of the piezoelectric membrane as shown in FIG. 5A. In a more general structure, electrodes can also be used on both sides of the membrane for better excitation of a desired mode, as shown in FIG. 5B. In such XBAR structures, harmonic shear modes with large electromechanical coupling coefficient can be excited by employing the multi-layer transduction structure of 22.

Figure 6A:
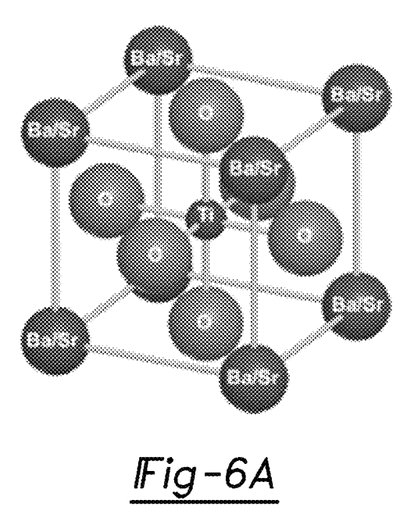
FIGS. 6A and 6B illustrate centrosymmetric crystal unit-cell of barium strontium titanate (BST) under no DC bias electric field and an applied electric field, respectively.
Figure 6B:
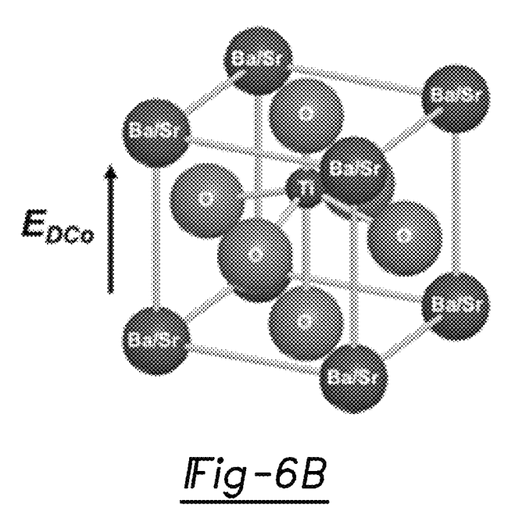
Figure 7:
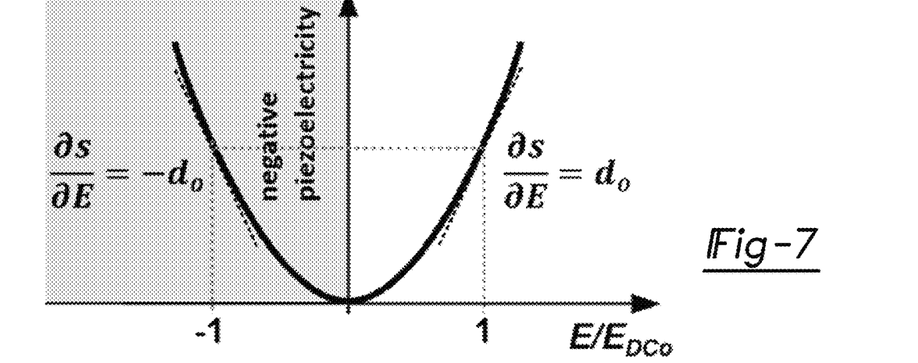
FIG. 7 is a graph showing the typical strain (S) versus normalized electric field curve for BST.

To demonstrate the concept, particular implementation using ferroelectric barium strontium titanate (BST) is described in greater detail. BST has a centrosymmetric cubic perovskite unit-cell in its paraelectric phase (above its phase transition temperature T$_c$), and the components of its piezoelectric tensor are all zero. A DC electric field, applied to BST shifts the center titanium ion along the field direction, which breaks centrosymmetry and induces piezoelectricity in BST (i.e., electric-field-induced piezoelectricity), as shown in FIGS. 6A and 6B. As shown in FIG. 7, BST thin film not only provides E-field induced piezoelectricity but also exhibits an E-field-induced 'negative' piezoelectricity, when biased to the left of the curve, as bias voltage polarity is switched. This property of ferroelectric BST (i.e., E-field induced piezoelectric and negative piezoelectric effect) can be leveraged to control the pattern of effective piezoelectric coefficient in bulk acoustic wave resonators containing multi-layers of BST. While reference is made to BST throughout this disclosure, it is readily understood other materials, which exhibit similar properties, also fall within the scope of this disclosure.

Figure 8A:
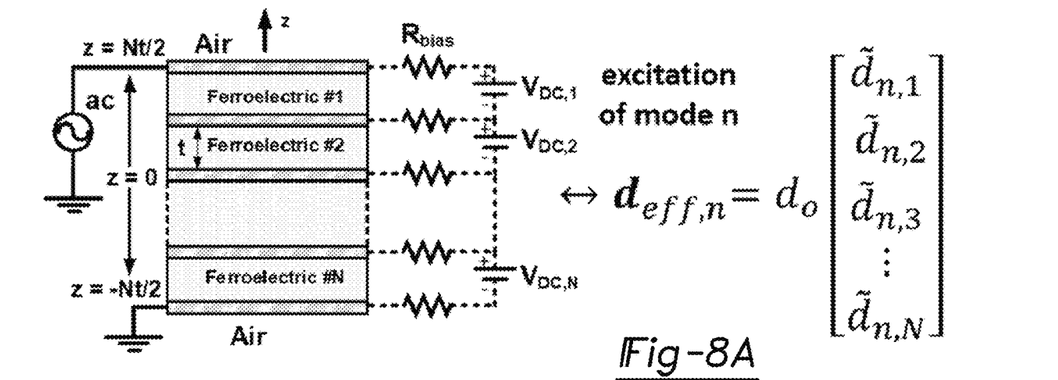
FIG. 8A is a diagram depicting an example embodiment for a bulk acoustic wave resonator.
Figure 8B:
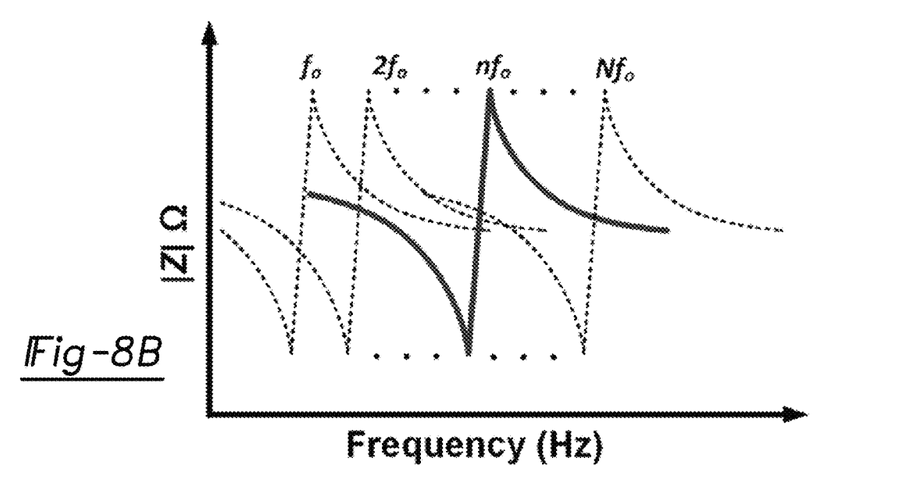
FIG. 8B is a graph showing the impedance response of the resonator in FIG. 8A.

FIG. 8A depicts an example embodiment of a bulk acoustic wave resonator. In this example, the transduction structure is comprised of multiple layers of BST. Additionally, electrodes are interposed between layers of BST. The electrodes allow for the generation of different patterns of non-uniform positive and negative piezoelectric coefficients, leading to selective support of different resonance modes excitations. In such a programmable bulk acoustic resonator, each resonance mode can be selected through a set of DC bias voltages applied across the ferroelectric layers to generate the appropriate pattern of the piezoelectric coefficients for that particular mode. While the use of electrodes has been employed to show proof of concept, it is readily understood that the principles described herein are applicable to resonator structure comprises of multiple layers alternating between a layer of piezoelectric material and a second layer of a material that exhibits a negative piezoelectric effect and without intermediate electrode layers disposed therebetween.

With continued reference to FIG. 8A, the multilayer device contains N BST layers, each having a thickness of t (total membrane thickness is Nt). In order to simplify the explanation of the behavior of such resonator, it is assumed that electrodes' thickness is infinitesimal. At a certain bias point, the general piezoelectric constitutive equations that relate the electrical and mechanical fields together are (2) and (3).

$$T = cS - eE \qquad (2)$$

$$D = eS + \epsilon E \qquad (3)$$

where $$S = \frac{\partial u}{\partial z}$$

(u is the particle displacement), T is stress, E is the small-signal electric field, D is electric displacement, c is elasticity, $\epsilon$ is equal to $$c \frac{ds}{dE}\bigg|_{E_{DC}},$$

and $\rho$ is material density. Substituting (2) into (3) leads to the wave equation of (4).

$$\frac{\partial^2 u}{\partial z^2} + \frac{\epsilon \rho}{(c\epsilon + e^2)} \omega^2 u = 0 \qquad (4)$$

The solution of (4) for the particle displacement field in the bulk of the device can be shown to be in the form of (5)

$$u(z) = a \cdot \sin(k_f z) + b \cdot \cos(k_f z) \qquad (5)$$

where $k_f$ is the acoustic propagation constant (wavenumber) in the ferroelectric:

$$k_f = \frac{\omega}{\sqrt{\frac{c}{\rho}\left(1 + \frac{e^2}{c\epsilon}\right)}} \qquad (6)$$

Assuming stress-free boundaries $$\frac{\partial u}{\partial z}\bigg|_{z=\pm \frac{Nt}{2}} = 0$$

the particle displacement field is simplified to (7) for odd and even modes, with resonance conditions given in (8).

$$u_n(z) = u_o \tilde{u}_n(z) = \begin{cases} u_o \sin(k_{f,n} z), n = 1, 3, 5, \ldots \\ u_o \cos(k_{f,n} z), n = 2, 4, 6, \ldots \end{cases} \qquad (7)$$

$$k_{f,n} \frac{Nt}{2} = n \cdot \frac{\pi}{2} \qquad (8)$$

The effective electromechanical coupling coefficient for each of these modes in an acoustic wave resonator is defined by Berlincourt formula (9).

$$K_{eff}^2 = \frac{U_m^2}{U_e U_d} \qquad (9)$$

where $U_m$ is mutual energy, $U_e$ is elastic energy, and $U_d$ is electrical energy stored in the dielectric material calculated by:

$$U_m = \frac{1}{2}\int_V d_{eff}(TE)dV, \ U_e = \frac{1}{2}\int_V sT^2 dV, \ U_d = \frac{1}{2}\int_V \epsilon E^2 dV \qquad (10)$$

where s is compliance, V is the volume, and $d_{eff}$ is the effective piezoelectric coefficient throughout the bulk of the resonator defined by:

$$d_{eff}(z) = d_o \tilde{d}(z) \qquad (11)$$

where $\tilde{d}(z)$ is the normalized pattern function for piezoelectric coefficient versus z, the axis normal the membrane. By substituting (7) and (10) into (9), and simplifying the results one can show that the $K_{eff}^2$ for the $n^{th}$ harmonic mode is equal to (12).

$$K_{eff}^2 = \frac{\left(\int_A \int_{-\frac{Nt}{2}}^{\frac{Nt}{2}} d_{eff}(z)ET(z)dz\right)^2}{\int_V \epsilon E^2 dV \int_V sT^2(z)dV} = \frac{\pi^2 K_{eff,1}^2}{16\left(\frac{Nt}{2}\right)^2}\left(\int_{-\frac{Nt}{2}}^{\frac{Nt}{2}} \tilde{d}(z)\tilde{u}_n'(z)dz\right)^2 \qquad (12)$$

where $K_{eff,1}^2$ is the electromechanical coupling coefficient of the fundamental mode for a conventional piezoelectric membrane resonator (i.e., $\tilde{d}(z) = 1$):

$$K_{eff,1}^2 = \frac{8}{\pi^2}\frac{d_o^2}{s\epsilon} \qquad (13)$$

Since all the longitudinal thickness modes $u_n$ and their derivatives are orthogonal to each other:

$$\int_{-Nt/2}^{Nt/2} u_n' u_m' dz = \begin{cases} 1, m = n \\ 0, m \neq n \end{cases} \qquad (14)$$

a single resonance mode n (1<n<N) can be turned on by creating an appropriate pattern of non-uniform piezoelectric coefficient proportional to stress field of that mode (e.g., for the $n^{th}$ harmonic mode: $\tilde{d}_n(Z) = \tilde{u}_n'(Z)$). Under this condition, only a single mode n (e.g., mode number n=1, 2, 3, . . . ) is excited with a constant electromechanical coupling coefficient.

Figure 9:
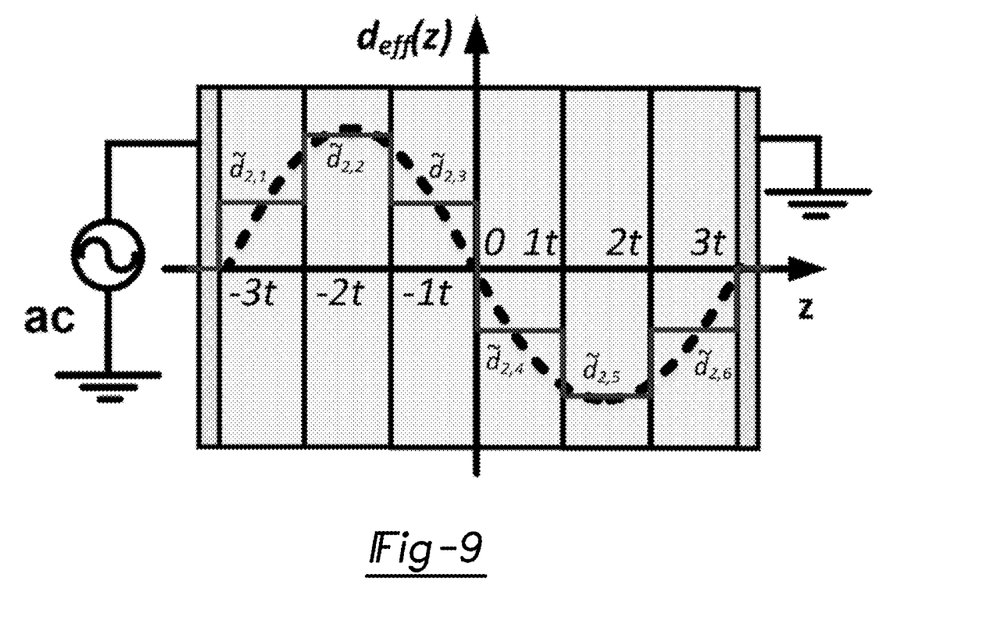
FIG. 9 is a diagram showing the ideal non-uniform pattern of effective piezoelectric coefficient (represented by the dashed line) for the selective excitation of a single mode in a 6-layer ferroelectric bulk acoustic wave resonator.

As an example, in a 6-layer ferroelectric FBAR, the required pattern of the non-uniform piezoelectric coefficient to excite only $2^{nd}$ harmonic mode (represented by dashed lines) is shown in FIG. 9. In reality, however, the piezoelectricity in each layer is a constant value; thus, one needs to find the step function pattern close to the ideal sinusoidal mode shape, as shown in dashed line in FIG. 9. This can be achieved by solving a set of N equations (16), step function version of (12)), to find an optimized $\tilde{d}_n(z)=[\tilde{d}_{n,1}, \tilde{d}_{n,2}, \ldots, \tilde{d}_{n,N}]$ that maximizes the $K_{eff,i=n}^2$ and minimizes $K_{eff,i\neq n}^2$, where $\tilde{d}_{n,i}$ is the normalized effective piezoelectric coefficient in each layer.

$$K_{eff,n}^2 = \frac{K_{eff,1}^2}{4n^2} \qquad (16a)$$

$$\left(\sum_{i=1}^N \tilde{d}_{n,i}\left[\sin\left(k_{f,n}\left((-N+2i)\frac{t}{2}\right)\right) - \sin\left(k_{f,n}\left((-N+2i-2)\frac{t}{2}\right)\right)\right]\right)^2$$

$$n = 1, 3, 5, \ldots$$

$$K_{eff,n}^2 = \frac{K_{eff,1}^2}{4n^2} \qquad (16b)$$

$$\left(\sum_{i=1}^N \tilde{d}_{n,i}\left[\cos\left(k_n\left((-N+2i)\frac{t}{2}\right)\right) - \cos\left(k_n\left((-N+2i-2)\frac{t}{2}\right)\right)\right]\right)^2$$

$$n = 2, 4, 6, \ldots$$

Accordingly, a set of DC bias voltages can be applied to the BST layers to realize the optimum $\tilde{d}_n(z)=[\tilde{d}_{n,1}, \tilde{d}_{n,2}, \ldots, \tilde{d}_{n,N}]$ for each mode. Thus, the programmable FBARs based on multi-layers of ferroelectric material can selectively resonate at a desired harmonic mode, allowing for the design of a new class of band-switchable devices, like filters and frequency agile oscillators. The programmable acoustic resonators not only eliminate the need for external switches but also reduce the number of required frequency selective components in RF modules.

A specific non-uniform piezoelectric pattern for the example of FIG. 8A is $\tilde{d}_n(z)=[+1, -1, \ldots, (-1)^{N+1}]$ (i.e., alternating positive and negative piezoelectric coefficients in BST layers) that excites the Nth harmonic mode having a electromechanical coupling coefficient $$K_{eff,N}^2 = \frac{8}{\pi^2} \frac{d_o^2}{s\epsilon},$$

equal to the fundamental mode $K_{eff,1}^2$. This is in contrast to single-layer piezoelectric resonators (i.e., $\tilde{d}(z)=1$), where all odd harmonic modes simultaneously coexist with rapidly decreasing effective electromechanical coupling coefficients that are inversely proportional to the square of mode numbers $$\left(\text{i.e., } K_{eff,n} = \frac{1}{n^2} K_{eff,1}^2, n = 1, 3, 5, \ldots \right)$$

Figure 10:
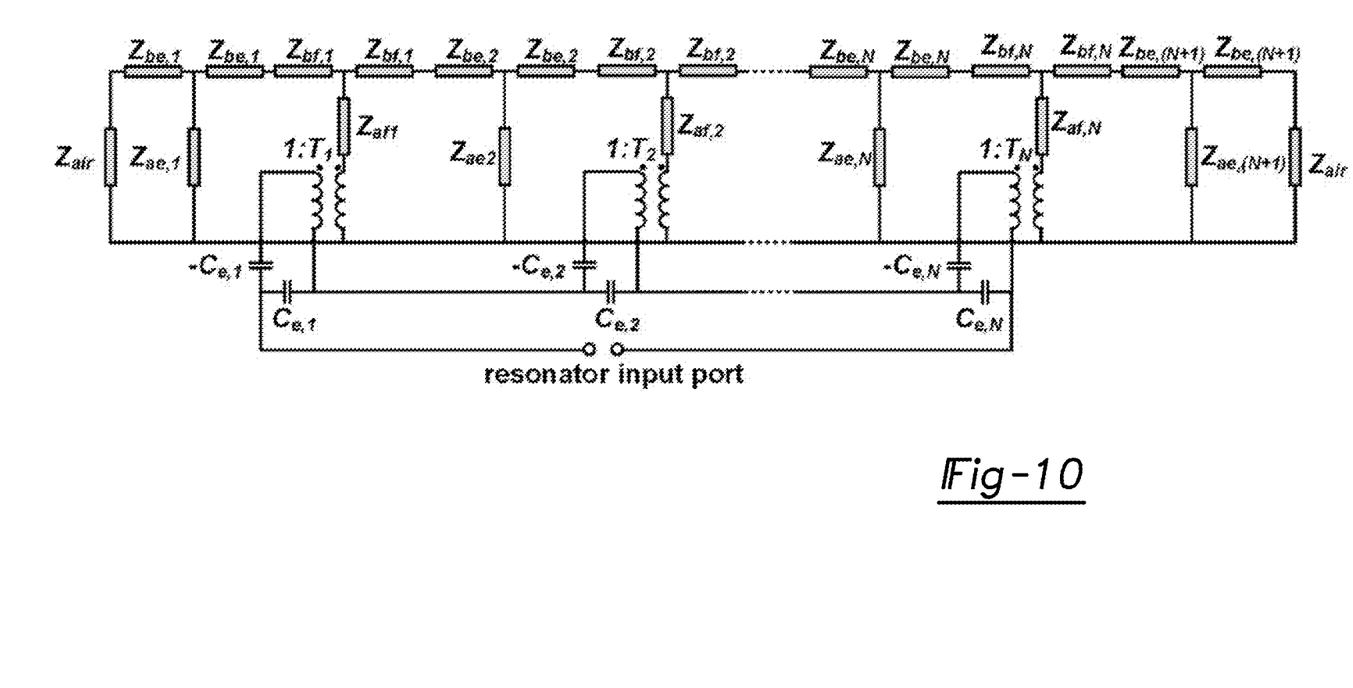
FIG. 10 is a Mason equivalent circuit model for a programmable ferroelectric FBAR containing N ferroelectric layers.

A one-dimensional physical model based on the Mason model arranged in a configuration shown in FIG. 10, can be used to analyze and optimize the performance of the multilayered resonators. This model allows one to design the thickness of different layers and predict the device parameters such as its impedance as a function of frequency. The harmonic resonance frequencies of the structure and their $K_{eff}^2$ can be estimated for different patterns of non-uniform piezoelectric coefficients. In this model, the acoustic to electrical domain transformation ration ($T_1$), for each BST layer is related to the effective piezoelectric coefficient in that layer through equation (17).

$$T_i = \frac{cd_{eff}c_{e,i}}{\epsilon} \qquad (17)$$

In the model of FIG. 10, $C_{e,i}$ is the electrical capacitance of each BST layer, and the rest of the parameters are calculated by (18)-(21).

$$Z_{be,i} = jZ_e A \times \tan(k_e \times t_{e,i}) \qquad (18)$$

$$Z_{ae,i} = \frac{-jZ_e A}{\sin(k_e \times 2t_{e,i})} \qquad (19)$$

$$Z_{bf,i} = jZ_f A \times \tan(k_f \times t_{f,i}) \qquad (20)$$

$$Z_{af,i} = \frac{-jZ_f A}{\sin(k_f \times 2t_{f,i})} \qquad (21)$$

where A is the resonator area, $Z_{air}$ is the acoustic impedance of the air, $Z_e$ and $Z_f$ are the acoustic impedance of the electrodes and the ferroelectric layers, $k_e$ and $k_f$ are the wavenumbers ($2\pi f$/acoustic velocity (v)) in electrodes and the ferroelectric layers, and $t_{e,i}$ and $t_{f,i}$ are the thickness of $i^{th}$ electrode and ferroelectric layer.

Figure 11:
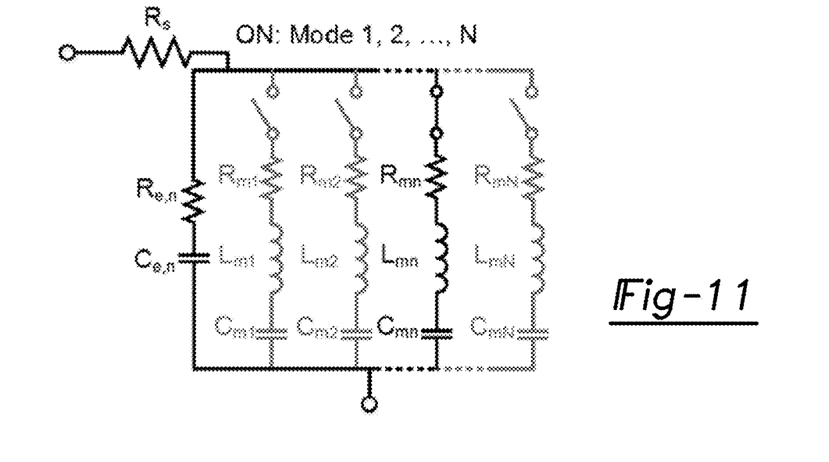
FIG. 11 is a lumped element model for multi-layer BST resonator.

The electrical response of a multilayer BST resonator can also be represented with the modified Butterworth-Van Dyke (mBVD) model with multiple switchable motional branches, as shown in FIG. 11. Such a model is useful in designing reconfigurable filters based on multilayer ferroelectric resonators. In this model, $C_{e,n}$ and $R_{e,n}$ account for the effective electrical capacitance and loss of the multi-layer structure calculated by (22) and (23). The capacitance ($C_{e,i}$) and quality factor ($Q_{e,i}$) in each layer is a function of the tunability of the deposited ferroelectric material and the applied voltage across that layer. The motional branch for mode n includes $R_{m,n}$, $L_{m,n}$, and $C_{m,n}$ that can be calculated with (24)-(26).

$$\frac{1}{c_{e,n}} = \sum_{i=1}^N \frac{1}{c_{e,i}(V_{DC,i})} \qquad (22)$$

$$R_{e,n} = \sum_{i=1}^N \frac{1}{c_{e,i}(V_{DC,i})Q_{e,i}} \qquad (23)$$

$$R_{m,n} = \frac{2\pi f_{r,n} L_{m,n}}{Q_{m,n}} \qquad (24)$$

$$C_{m,n} = C_{e,n}\left[\left(\frac{f_{a,n}}{f_{r,n}}\right)^2 - 1\right] \qquad (25)$$

$$L_{m,n} = \frac{1}{c_{m,n}(2\pi f_{r,n})^2} \qquad (26)$$

In above equations the resonance ($f_r$) and anti-resonance frequency ($f_a$) and accordingly the effective electromechanical coupling coefficient of each harmonic mode are determined from the resonator's Mason model calculations.

Figure 12:
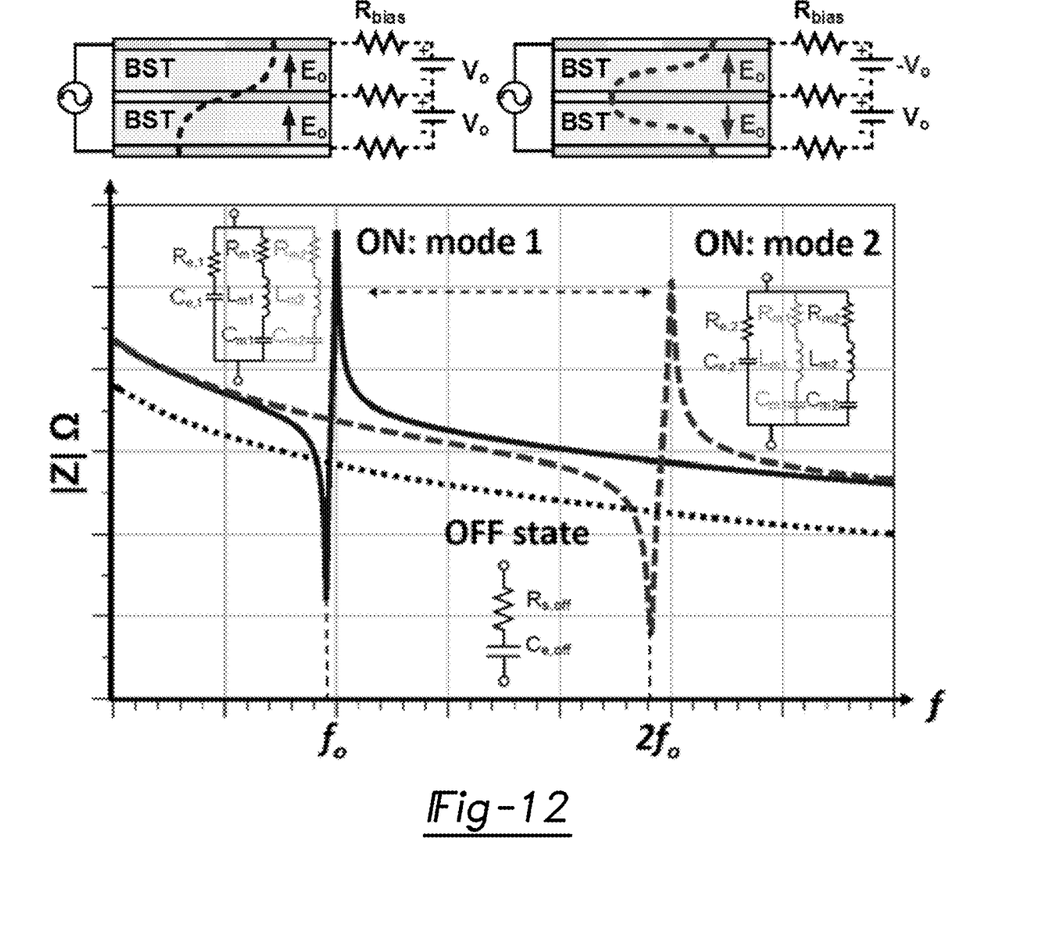
FIG. 12 shows the bilayer BST resonator particle displacement distribution for mode 1 with DC bias of $V_{DC} \times [1,1]$ and mode 2 with DC bias of $V_{DC} \times [1,-1]$ and their corresponding impedance response.

To validate the theoretical analysis, a bilayer ferroelectric BST FBAR is designed and fabricated. The resonator is then used to implement a reconfigurable band-switching ferroelectric FBAR filter. Referring to FIG. 12, a FBAR based on a bilayer ferroelectric thin film BST membrane structure can be biased to selectively resonate at its even or odd harmonic modes. When DC bias voltages with a similar polarities are applied across both BST layers, the sign and magnitude of the induced effective piezoelectric coefficient in BST films are similar; the entire structure behaves like a conventional FBAR, operating at its fundamental mode ($f_1$) with a half-wavelength acoustic standing wave across the resonator (mode 1). However, when the two DC bias voltages with opposite polarities are applied to the bilayer BST FBAR, the ferroelectric layers exhibit effective piezoelectric coefficients that are opposite in sign, hence resonator's second resonance mode can be excited (the two BST films vibrate in antiphase direction). Therefore, by alternating the polarity of the DC bias voltages applied to the ferroelectric layers, the device can resonate at even or odd harmonic modes. Based on (12), both mode 1 and 2 are expected to provide the same $K_{\it eff}^2$. The typical electrical impedance response of a bilayer stacked BST FBAR operating at modes 1 and 2, as well as its OFF state is shown in FIG. 12.

Figure 13:
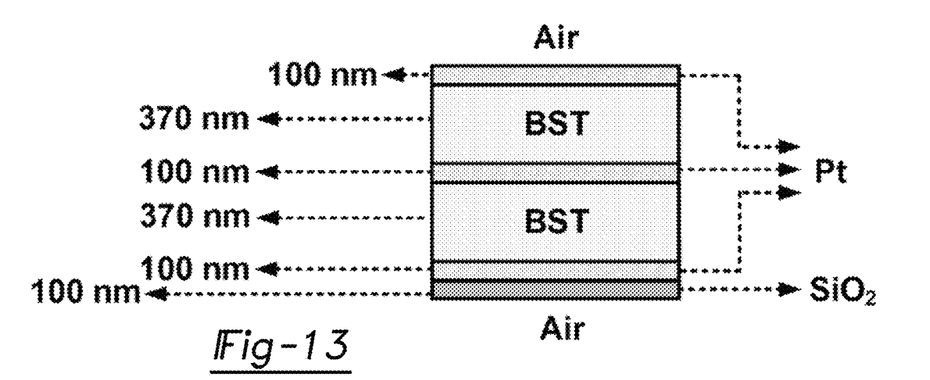
FIG. 13 is a diagram of an example: a bilayer BST resonator structure and finalized thickness values for each layer.

A bilayer BST FBAR is designed and the cross-sectional view of the device is shown in FIG. 13. The device contains two BST layers sandwiched between three Pt electrodes. The thickness of the Pt electrodes is set to 100 nm, and the thickness of the BST layers is determined based on the desired resonance frequencies by using the Mason model for the device. Based on simulations, the electromechanical coupling coefficient for mode 1 ($K_{\it eff,1}$) and mode 2 ($K_{\it eff,2}$) to be 8% and 7%, respectively. The small variation in the $K_{\it eff}^2$ of the two modes is due to the finite thickness of the electrodes and the addition of the oxide layer.

Figure 15:
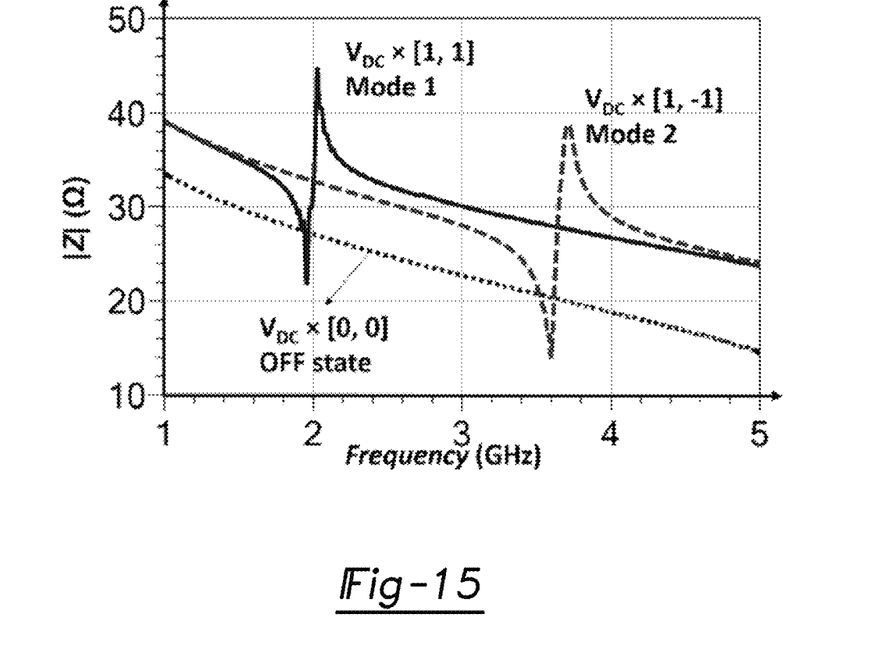
FIG. 15 presents the measured impedance response of a bilayer BST FBAR for its first and second mode.

The S-parameters of the bilayer BST resonators are measured using a vector network analyzer. The impedance response of the measured device is shown in FIG. 15. The electromechanical coupling coefficient for mode one and mode 2 are measured to be 8% and 7%, which agree with the theoretical calculations.

Figure 14A:
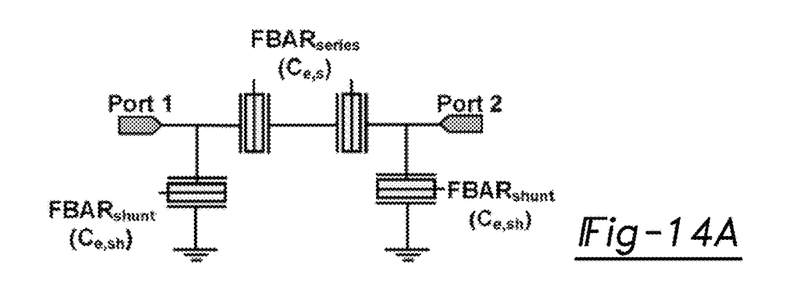
FIG. 14A is a schematic of the 1.5 stage ladder-type network filter based on bilayer BST FBARs.
Figure 14B:
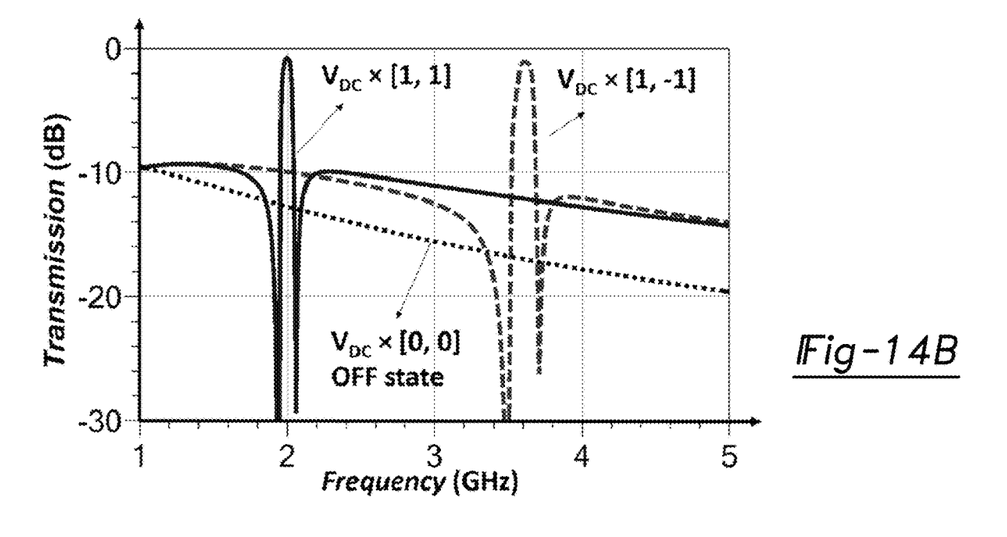
FIG. 14B is a diagram showing the transmission response for mode 1, mode 2, and OFF state of the filter in FIG. 13A.

The bilayer BST FBAR is then employed to design a 1.5-stage ladder-type network filter. The schematic of the designed filter is provided in FIG. 14A. The device is expected to provide a reconfigurable transfer function with three transmission states: mode 1 and mode 2, along with OFF state isolation. The filter is simulated based on the model provided in FIG. 11 and its transmission response in all the three states is provided in FIG. 14B.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The invention claimed is:

1. A bulk acoustic wave resonator designed to excite a particular resonance harmonic mode, comprising;
   a first electrode;
   a second electrode; and
   a transduction structure fabricated on a substrate, the transduction structure comprised of N layers of piezoelectric material with values of piezoelectric coefficients configured to mimic shape of the particular resonance harmonic mode, where at least three of the N layers of piezoelectric materials having piezoelectric coefficients different from each other, where the resonator is configured to exhibit an electromechanical coupling coefficient that remains constant between a fundamental mode and a nth resonance harmonic mode of the resonator;
   wherein the first electrode and the second electrode are disposed on same side of the transduction structure to laterally excite the resonator, thereby forming a laterally excited bulk acoustic wave resonator (XBAR).

2. The bulk acoustic wave resonator of claim 1 wherein the first electrode and the second electrode are configured to receive an electric signal and the transduction structure converts the electric signal to an acoustic wave within the resonator.

3. The bulk acoustic wave resonator of claim 1 wherein at least one of the N layers of piezoelectric material exhibits a negative piezoelectric effect.

4. The bulk acoustic wave resonator of claim 1 wherein the N layers of piezoelectric material are in direct contact with each other.

5. The bulk acoustic wave resonator of claim 1 further comprises a bias electrode disposed between two of the N layers of piezoelectric material and configured to receive a bias voltage.

6. The bulk acoustic wave resonator of claim 1 wherein the material for the N layers of piezoelectric material is selected from a group consisting of copper indium thiophosphate, aluminum nitride, scandium aluminum nitride, barium titanate, strontium titanate, barium strontium titanate, lithium niobate, trialkylbenzene tricarboxamide and polyvinylidene fluoride and its copolymers with trifluoroethylene.

7. A bulk acoustic wave resonator, comprising;
a first electrode;
a second electrode; and
a transduction structure fabricated on a substrate, wherein the transduction structure is comprised of N layers of piezoelectric material without any electrodes disposed between the N layer of piezoelectric material, where piezoelectric coefficients of the N layers of piezoelectric material are different from each other and are configured to excite a particular resonance harmonic mode;
wherein the first electrode and the second electrode are disposed on same side of the transduction structure to laterally excite the resonator, thereby forming a laterally excited bulk acoustic wave resonator (XBAR); and
where the resonator is configured to exhibit an electromechanical coupling coefficient that remains ideally constant between a fundamental mode and a for the nth resonance harmonic mode of the resonator.

8. The bulk acoustic wave resonator of claim 7 wherein the resonator is configured to exhibit an electromechanical coupling coefficient that remains theoretically constant for the nth resonance harmonic mode.

9. The bulk acoustic wave resonator of claim 7 wherein at least one of the N layers of piezoelectric material exhibits a negative piezoelectric effect.

10. The bulk acoustic wave resonator of claim 7 wherein the material for the N layers of piezoelectric material is selected from a group consisting of copper indium thiophosphate, aluminum scandium nitride, barium strontium titanate, trialkylbenzene tricarboxamide and polyvinylidene fluoride and its copolymers with trifluoroethylene.

11. A bulk acoustic wave resonator designed to excite a particular resonance harmonic mode, comprising;
a first electrode;
a second electrode; and
a transduction structure fabricated on a substrate, the transduction structure comprised of N layers of piezoelectric material with values of piezoelectric coefficients configured to mimic shape of the particular resonance harmonic mode, where at least one of the N layers of piezoelectric materials exhibits a negative piezoelectric effect and at least three of the N layers of piezoelectric materials have piezoelectric coefficients different from each other, where the resonator is configured to exhibit an electromechanical coupling coefficient that remains constant between a fundamental mode and a nth resonance harmonic mode of the resonator.

12. The bulk acoustic wave resonator of claim 11 is fabricated on a substrate, where a portion of the substrate under the resonator structure is removed, thereby forming a film bulk acoustic resonator (FBAR).

13. The bulk acoustic wave resonator of claim 11 is fabricated on a substrate with a reflector disposed between the resonator structure and the substrate, thereby forming a solidly mounted resonator structure (SMR).

14. The bulk acoustic wave resonator of claim 11 is fabricated on a substrate, where both electrodes are used on one side of the transduction structure to laterally excite the resonator, thereby forming a laterally excited bulk acoustic wave resonator (XBAR).

* * * * *

UNITED STATES PATENT AND TRADEMARK OFFICE
CERTIFICATE OF CORRECTION

PATENT NO. : 12,206,388 B2
APPLICATION NO. : 17/237215
DATED : January 21, 2025
INVENTOR(S) : Amir Mortazawi et al.

Page 1 of 1

It is certified that error appears in the above-identified patent and that said Letters Patent is hereby corrected as shown below:

In the Claims

At Column 13, Claim number 7, Line number 30, after "material" delete "are different from each other and".

Signed and Sealed this
Eighteenth Day of March, 2025

Coke Morgan Stewart
*Acting Director of the United States Patent and Trademark Office*